United States Patent [19]
Possin et al.

[11] Patent Number: 5,631,473
[45] Date of Patent: May 20, 1997

[54] SOLID STATE ARRAY WITH SUPPLEMENTAL DIELECTRIC LAYER CROSSOVER STRUCTURE

[75] Inventors: George E. Possin; Robert F. Kwasnick, both of Schenectady; Roger S. Salisbury, Niskayuna, all of N.Y.

[73] Assignee: General Electric Company, Schenectady, N.Y.

[21] Appl. No.: 493,020

[22] Filed: Jun. 21, 1995

[51] Int. Cl.$^6$ .......................... H01L 29/04; H01L 31/062
[52] U.S. Cl. ............... 257/59; 257/72; 257/292; 257/446; 257/448; 257/758
[58] Field of Search ................... 257/292, 291, 257/59, 72, 758, 760, 446, 448; 359/54, 57, 59, 87, 88

[56] References Cited

U.S. PATENT DOCUMENTS

| | | | |
|---|---|---|---|
| 4,688,896 | 8/1987 | Castleberry | 350/333 |
| 4,804,953 | 2/1989 | Casteleberry | 340/784 |
| 5,062,690 | 11/1991 | Whetten | 359/59 |
| 5,303,074 | 4/1994 | Salisbury | 359/59 |
| 5,486,939 | 1/1996 | Fulks | 359/74 |

OTHER PUBLICATIONS

Application entitled, "Repair Line Structure for Thin Film Electronic Devices," Ser. No.–08/169,290, filed Dec. 20, 1993; now U.S. Pat. No. 5,475,246; Wei et al.; issue date Dec. 1995.

Application entitled, "Address Line Repair Structure and Method for Thin Film Imager Devices," Ser. No. 08/436, 681, May 8, 1995; now U.S. Pat. No. 5,480,812; Salisbury; issue date Jan. 1996.

Application entitled, "Method of Isolating Vertical Shorts in an Electronic Array," Ser. No. 08/115,082, Sep. 2, 1993, now U.S. Pat. No. 5,518,956; Liu et al.; issue May 1996.

Application entitled, "Method of Locating Common Electrode Shorts in an Imager Assembly," Ser. No. 08/161,037, filed Dec. 3, 1993, now U.S. Pat. No. 5,463,322; Kwasnick et al., issue date Oct. 1995.

Application entitled, "Post–Fabrication Repair Structure and Method for Thin Film Imager Devices," Ser. No. 08/280, 970, Jul. 27, 1994, pending.

*Primary Examiner*—Minh-Loan Tran
*Attorney, Agent, or Firm*—Donald S. Ingraham

[57] ABSTRACT

A solid state array device includes a plurality of pixels with associated respective TFT switching transistors; a plurality of first address lines disposed in a first layer of the array device; a plurality of second conductive address lines disposed in a second layer of the array device, respective ones of said first and second address lines being disposed substantially perpendicular to one another in a matrix arrangement such that respective ones of the second address lines overlie respective ones of the first address lines at respective crossover regions; a TFT gate dielectric layer disposed in a channel region of each of the pixel TFTs and further being disposed over the first address lines; and a crossover region supplemental dielectric layer disposed in respective ones of the crossover regions between the first and second address lines, but disposed so as to not extend over the TFT channel regions.

16 Claims, 2 Drawing Sheets

SOLID STATE ARRAY WITH SUPPLEMENTAL DIELECTRIC LAYER CROSSOVER STRUCTURE

This invention relates generally to large area solid state imager devices and specifically to address line crossover structures for large area imager devices.

Solid state imaging devices can be used for detection of incident radiation. Such imager devices typically comprise an array of pixels with an associated matrix of rows and columns of address lines to electrically access each pixel. Each pixel has a photosensor and a switching transistor, such as a thin film transistor (TFT), the gate of which is coupled to a scan line and the source of which (or alternatively, the drain) is coupled to a data line. These address lines are used read the signal from respective pixel photosensors.

The various components in an imager device are formed in layers on a substrate such that components are sandwiched within the completed structure. For example, scan lines and data lines are disposed in a matrix structure such that data lines overlie scan lines at crossover points in each pixel of the array. Defects in the array, such as short circuits between scan lines and data lines commonly appear in crossover regions. Such defects can seriously degrade imager performance, particularly in high performance imagers such as are used in medical diagnostic imaging.

Typically, the TFT gate dielectric material is disposed over the array so as to be disposed between the scan lines and address lines at crossover points. Such single layer dielectrics are subject to degradation that can result in a conductive path between the scan and data lines in the crossover region, shorting the address lines and degrading array performance. Typically, additional dielectric material disposed on the array is disposed over the entire region of the scan lines and TFT channel regions of the array (having been formed, for example, by the oxidation of the scan line and gate electrode conductive material); this arrangement leads to degraded TFT performance because of reduced capacitance in the TFT channel region (and thus results in higher noise in the imager array).

SUMMARY OF THE INVENTION

In accordance with this invention, a solid state array structure, such as an imager or display device, is provided that has a robust dielectric structure between address lines at crossover regions in the array while maintaining thin film transistor (TFT) performance, and further providing reduced data line capacitance and thus reduced noise in the array.

A solid state array device in accordance with this invention includes a plurality of pixels with associated respective TFT switching transistors; a plurality of first address lines disposed in a first layer of the array device; a plurality of second conductive address lines disposed in a second layer of the array device, respective ones of said first and second address lines being disposed substantially perpendicular to one another in a matrix arrangement such that respective ones of the second address lines overlie respective ones of the first address lines at respective crossover regions; a TFT gate dielectric layer disposed in a channel region of each of the pixel TFTs and further being disposed over the first address lines; and a crossover region supplemental dielectric layer disposed in respective ones of the crossover regions between the first and second address lines, but disposed so as to not extend over the TFT channel regions.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1A:
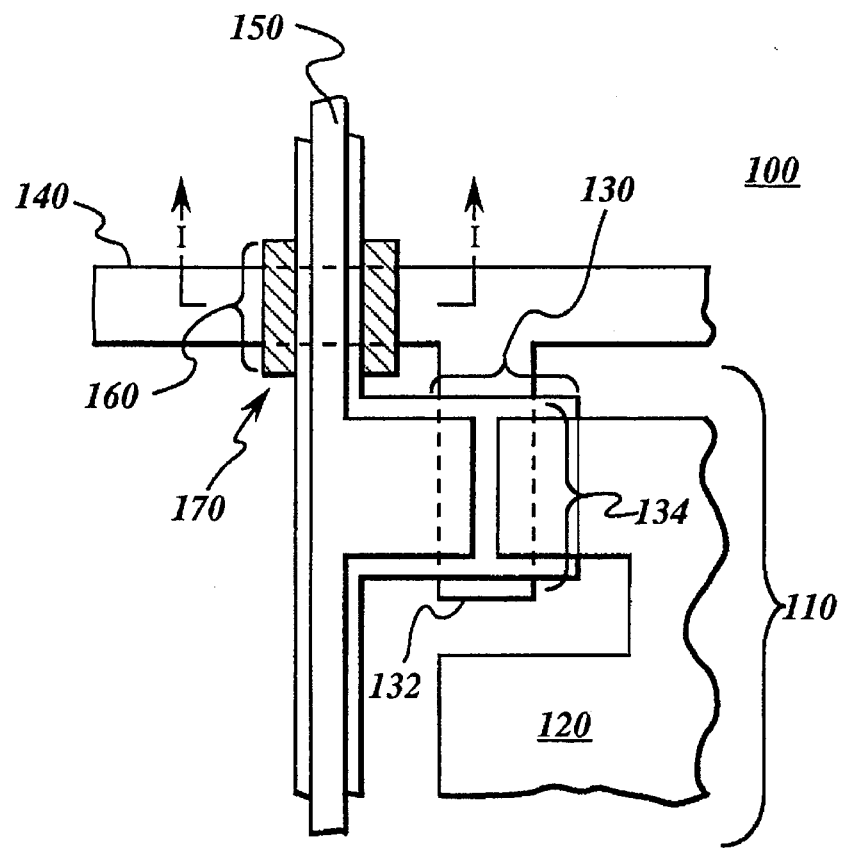
FIG. 1(A) is a plan view of a portion of an array having a crossover region in accordance with the present invention.

A solid state array device 100, such as a radiation imager for detecting electromagnetic radiation such as x-rays or the like, or a display device comprising liquid crystal devices, comprises a plurality of pixels 110 (a representative portion of one pixel being illustrated in FIG. 1 (A)) and a plurality of first address lines 140 and a plurality of second address lines 150 that are coupled to respective ones of pixels 110, as illustrated in FIG. 1 (A). By way of example, and not limitation, the invention will be described with respect to a radiation imager using the nomenclature associated with such a device; the invention is similarly applicable to an array structure used in display devices. In a typical imager, each pixel 110 comprises a respective photosensor 120 and a switching transistor 130, such as a thin film transistor (TFT) or the like. In imager 100, first address lines 140 typically are referred to as scan lines and are coupled to a gate 132 of TFT 130; signals on these lines are used to cause the TFT to become conductive or non-conductive. Second address lines 150 are typically referred to as data lines, and are coupled to respective drains 134 of TFTs 130; the source of TFT 130 is coupled to photosensor 120 (as used herein for TFT 130, both the source and drain of the transistor are used for electrical coupling and the specific nomenclature of source and drain is interchangeable). Scan lines 140 and data lines 150 are disposed in the array substantially perpendicular to one another in a matrix arrangement such that data lines 150 overlie scan lines at each pixel in a crossover region 160.

Figure 1B:
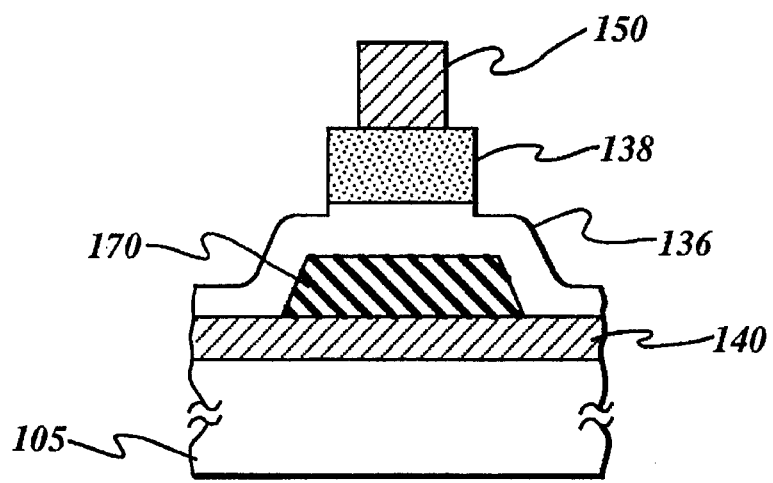
FIG. 1(B) is a cross-sectional view of the crossover region taken along the lines I—I of FIG. 1 (A).

In accordance with this invention, imager 100 further comprises a crossover region supplemental dielectric layer 170 that is disposed between scan line 140 and data line 150 in crossover region 160. As illustrated in FIG. 1(B), a cross-sectional view of crossover region 160, scan line 140 is disposed on substrate 105 that comprises glass or the like. Scan line 140 typically comprises a conductive material such as aluminum, titanium, molybdenum, or the like, and has a thickness in the range between about 0.1 μm and 1 μm.

Typically supplemental dielectric layer 170 is disposed directly on scan line 140, with a gate dielectric layer 136 disposed over dielectric layer 170; alternatively, gate dielectric layer 136 is disposed directly on scan line 140 and supplemental dielectric layer 170 is disposed over the gate dielectric layer (dependent on array structure and fabrication techniques, dielectric layer 170 may be disposed directly on scan line 140 or, alternatively, portions of the semiconductor (e.g., silicon) or conductor material (e.g., doped silicon) of the TFT sandwich structure can be disposed between the scan line and dielectric layer 170). Gate dielectric layer 136 extends over crossover region 160 and a channel region 134 of TFT 130 (the channel region includes the area over gate electrode 132), and typically is disposed across the array so as to electrically insulate scan lines 140 from other array components. Gate dielectric layer typically has a thickness in the range between about 0.1 µm and 0.5 µm and comprises an inorganic dielectric material such as silicon oxide, silicon nitride, or silicon oxy-nitride, but may alternatively comprise polyimide or similar polymer. In crossover region 160, data line 150 is disposed over gate dielectric layer 136; in some arrangements, such as illustrated in FIG. 1(A), data line 150 is disposed on a semiconductive layer 138 that is typically formed from the amorphous silicon deposited in the formation of TFT 130. Semiconductive layer 138 typically has a thickness in the range between about 0.05 µm and 0.5 µm. Additional layers (not pertinent to the present invention) of conductive, semiconductive, and dielectric material (e.g., n+ type doped silicon deposited over the silicon) are deposited in the formation of the imager array, but are not shown for ease of illustration.

Supplemental dielectric layer 170 is disposed over scan line 140 in crossover region 160 and comprises an electrically insulative material such as an inorganic dielectric, for example silicon oxide, silicon nitride, or the like, or alternatively, an organic dielectric, for example a polymer material such as polyimide, or combinations thereof. Inorganic dielectric material such as silicon oxide and silicon nitride are readily deposited in a plasma enhanced chemical vapor deposition (PECVD) process that is compatible with current array fabrication techniques (e.g., for TFTs, address lines, and photosensors). Organic dielectric materials such as polyimide are also readily spun on and cured at this stage of the fabrication process as the curing temperatures of about 300° C. do not have an adverse effect on the array at the stage of the array fabrication process when the supplemental dielectric layer is formed. The thickness of supplemental dielectric layer 170 is in the range between about 0.1 µm and 1 µm for the inorganic dielectric materials, and up to several microns thickness for organic dielectric materials.

Figure 2A:
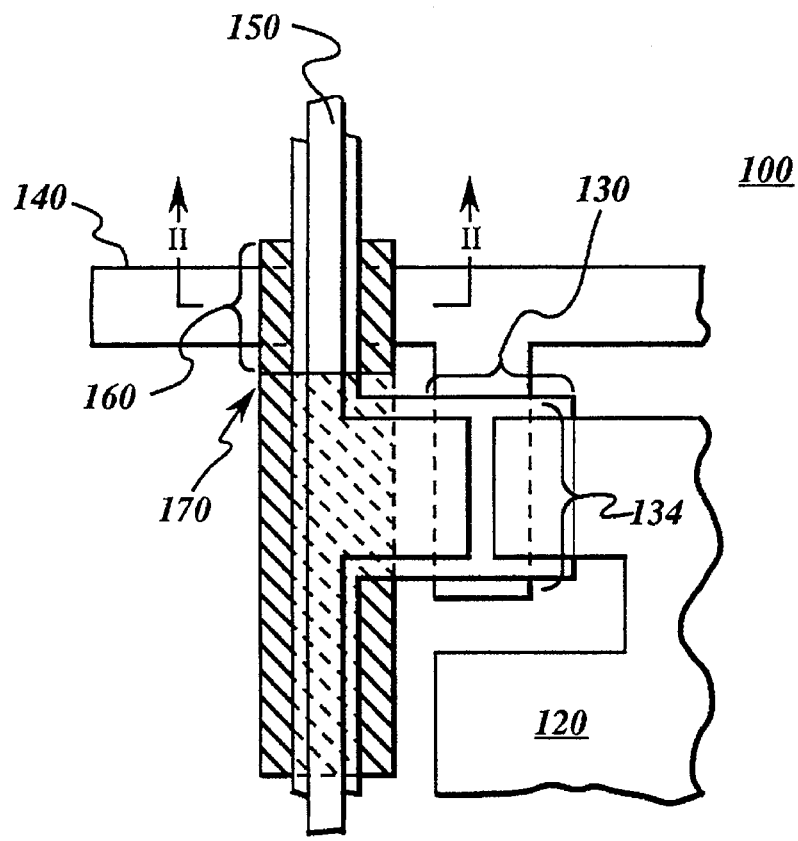
FIG. 2(A) is a plan view of a portion of an array in accordance with another embodiment of the present invention.

The lateral extent (or boundaries) of supplemental dielectric layer 170 typically extend beyond the immediate crossover area (that is, the area of overlap of scan line 140 and data line 150) so that the supplemental dielectric layer forms an island structure centered on crossover region 160 and that extends up to about 3 µm (on either side, or a total of 6 µm total difference in width) beyond the lateral extent of scan line 140 or data line 150, as illustrated in FIG. 1(A) (in FIG. 1(A) and 2(A) the portion of supplemental dielectric layer underlying data line 150 is shown in phantom). The supplemental dielectric layer 170 island structure does not extend into a channel region 134 of TFT 130; this structure provides enhanced operation of the TFT and the array because the dielectric thickness in the channel region is not greater than the thickness of the gate dielectric layer. Additional dielectric thickness beyond that of the gate dielectric layer has the effect of requiring an increase in the TFT size to achieve acceptable transient response of the pixel. Disadvantages of larger size TFTs include an increase of noise in the array and higher required driving voltages than smaller size TFTs, both of which degrade array performance.

Figure 2B:
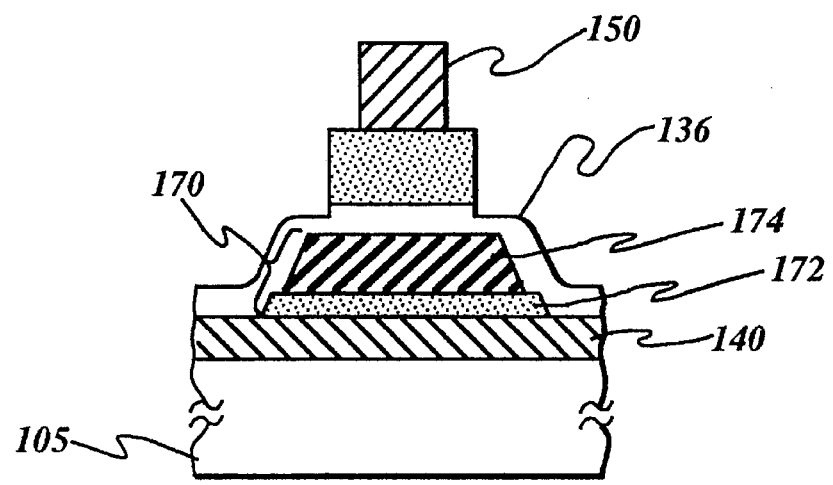
FIG. 2(B) is a cross-sectional view of the crossover region taken along the lines I—I of FIG. 2(A).

In an alternative embodiment, crossover region supplemental dielectric layer 170 comprises first tier 172 and a second tier 174, as illustrated in FIG. 2(B). In this arrangement, second tier 174 comprises organic or inorganic dielectric material as discussed above to provide the robust additional insulative protection at the crossover region between scan lines 140 and data lines 150. First tier 172 comprises a material that serves as an etch stop layer for the dielectric material comprising second tier 174. The etch stop layer minimizes any etching of glass substrate 105 during the etching steps to pattern second tier 174 of the supplemental dielectric layer. As used herein, "etch stop layer" or the like refers to a material that has an etch rate less than 20% of that of the overlying dielectric material in second tier 174 (e.g., using the etchants commonly or typically used in the art for etching of the dielectric material of second tier 174). For example, inorganic dielectric materials silicon oxide and silicon nitride comprising second tier 174 are commonly etched with a solution of 10% buffered HF; etch stop layer 172 advantageously comprises a semiconductive material such as amorphous silicon, which etches at a slower rate (nominally zero) than the silicon nitride or silicon oxide, which have an etch rate about 100Å/min in the same etchant. First tier etch stop layer 172 alternatively comprises a conductive material which is etchable with an etchant that is specific to the etch stop layer but not to the underlying scan line material. Thus, etching of the etch stop layer would not result in etching of the scan line material. For example, in embodiments in which scan lines 140 comprise titanium, molybdenum, or aluminum, chromium is effectively used as first tier etch stop layer 172. The thickness of first tier etch stop layer 172 is typically in the range between about 10 nm and about 200 nm; the overall thickness of crossover region supplemental dielectric layer is in the range between 0.1 µm and about 1 µm. In another alternative embodiment, the conductive material comprising TFT gates and scan lines 140 is not patterned prior to deposition of the supplemental dielectric layer so as to serve as the etch stop when patterning the supplemental dielectric; in this embodiment (not shown), the gate or scan line material underlies the supplemental dielectric layer.

In a further alternative embodiment, crossover region supplemental dielectric layer 170 is disposed in crossover region 160 and further disposed under the length of data line 150, as illustrated in FIG. 2(A). As noted above, supplemental dielectric layer 170 does not extend into channel region 134 of TFT 130. One advantage of this embodiment is that when the supplemental dielectric layer is disposed along the length of the data line, the data line conductive material has fewer steps (changes in elevation as the line passes over underlying components) along its length and thus in array fabrication fewer defects (or breaks) in the line occur, and hence the structure results in a higher yield.

The present invention thus provides a robust dielectric structure disposed between first address lines 140 (scan lines) and second address lines 150 (data lines) in crossover regions 160 that reduces the likelihood of electrical shorts between the crossing address lines. The structure further is patterned such that it does not degrade TFT characteristics as it does not extend into the channel region of the TFT. The structure of the present invention thus provides advantages over larger area dielectric structures, such as might be obtained by oxidizing the upper portion of the first address line conductive material to provide the additional dielectric structure (in addition to the gate dielectric layer), because such a wide-area oxidation process necessarily results in oxidation of the portion of the first address line material that comprises the gate electrode of the TFT. The structure of the present invention further reduces data line capacitance, which is a major contributor to noise in a large area (e.g., about 100 $cm^2$ or larger) imager. Such capacitance reduction results in the increased separation between the data line and the scan line at crossover regions 160 (e.g., the increased separation corresponding to the thickness of supplemental dielectric layer 170). For example, in an imager having a pixel area of about 40,000 $\mu m^2$, crossover supplemental dielectric layers 170 having a thickness of about 1 $\mu m$ provide an array with a capacitance reduction between scan and data lines of about 20% over the equivalent array structure without the supplemental dielectric layers.

It will be apparent to those skilled in the art that, while the invention has been illustrated and described herein in accordance with the patent statutes, modifications and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A solid state array device having a plurality of pixels with associated respective thin film transistors (TFT) disposed on a substrate, the device comprising:

a plurality of first address lines disposed in a first layer of said array device, said first address lines comprising conductive material and being coupled to respective ones of the pixel TFTs;

a plurality of second conductive address lines disposed in a second layer of said array device, respective ones of said first and second address lines being disposed substantially perpendicular to one another in a matrix arrangement such that respective ones of said second address lines overlie respective ones of said first address lines at respective pixel crossover regions, said second address lines further being coupled to respective ones of said pixel TFTs;

a TFT gate dielectric layer disposed in a channel region of each of said pixel TFTs and further being disposed over said first address lines and under said second address lines; and a crossover region supplemental dielectric layer disposed between said first address line and said TFT gate dielectric layer in respective ones of said crossover regions but not extending over said TFT channel regions.

2. The array of claim 1 wherein said crossover region supplemental dielectric layer comprises a dielectric material selected from the group of inorganic dielectric materials and organic dielectric material.

3. The array of claim 2 wherein said inorganic dielectric materials comprises silicon oxide and silicon nitride.

4. The array of claim 2 wherein said organic dielectric materials comprise polyimides.

5. The array of claim 2 wherein said crossover region supplemental dielectric layer comprises a crossover material different than the dielectric material comprising said TFT gate dielectric layer.

6. The array of claim 5 wherein said crossover region supplemental dielectric layer comprises a material other than an oxide of conductive material disposed in said first address lines.

7. The array of claim 2 wherein said crossover region supplemental dielectric layer comprises a crossover island, said island being disposed such that it does not underlie said TFT gate electrode and the portion of said second address line coupled to said TFT.

8. The array of claim 2 wherein said crossover region supplemental dielectric layer is disposed such that it underlies said crossover region between said first and second address lines, and further is disposed so as to underlie the respective lengths of said second address lines.

9. The array of claim 2 wherein said crossover region supplemental dielectric layer is disposed such that the width of said supplemental dielectric layer is not greater than about 6 $\mu m$ than the width of the overlying second address line.

10. The array of claim 2 wherein the thickness of said crossover region supplemental dielectric layer is in the range between about 0.1 $\mu m$ and about 1 $\mu m$.

11. The array of claim 2 wherein said crossover region supplemental dielectric layer comprises a first tier and a second tier, said second tier comprising said organic or inorganic dielectric material and said first tier comprising an etch stop layer.

12. The array of claim 11 wherein said etch stop layer comprises material having an etch rate less than 20% of the etch rate of the material of said second tier in the etchant used for patterning of said second tier.

13. The array of claim 11 wherein said second tier comprises a material selected from the group of materials consisting of silicon oxide and silicon nitride, and said first tier etch stop layer comprises a material selected from the group of material consisting of semiconductive and conductive materials.

14. The array of claim 13 wherein said first tier etch stop layer semiconductive material comprises amorphous silicon and said first tier etch stop layer conductive material comprises chromium.

15. The array of claim 11 wherein said first tier etch stop layer has a thickness in the range between about 10 nm and about 200 nm.

16. The array of claim 1 wherein said array comprises an x-ray imager device, each of said pixels comprises a photosensor, said first address lines comprise scan lines, and said second address lines comprise data lines.

* * * * *